United States Patent
Newton

(10) Patent No.: US 6,577,195 B2
(45) Date of Patent: Jun. 10, 2003

(54) BIPOLAR DIFFERENTIAL AMPLIFIER

(75) Inventor: Anthony Newton, Vaud (CH)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/197,145

(22) Filed: Jul. 16, 2002

(65) Prior Publication Data

US 2003/0020543 A1 Jan. 30, 2003

(30) Foreign Application Priority Data

Jul. 27, 2001 (GB) .............................................. 0118499

(51) Int. Cl.[7] ................................................. H03F 3/45
(52) U.S. Cl. ...................................... 330/252; 330/261
(58) Field of Search ................................. 330/252, 257, 330/261, 195

(56) References Cited

U.S. PATENT DOCUMENTS

| 3,918,004 | A | * | 11/1975 | Shimizu et al. ........... 330/30 D |
| 4,110,635 | A | | 8/1978 | Hongu et al. |
| 4,972,158 | A | * | 11/1990 | Sutterlin ...................... 330/255 |
| 5,184,086 | A | * | 2/1993 | Inohana et al. ............. 330/252 |

FOREIGN PATENT DOCUMENTS

| GB | 2329774 | 3/1999 |
| GB | 2329775 | 3/1999 |

* cited by examiner

*Primary Examiner*—Henry Choe

(57) ABSTRACT

A bipolar differential amplifier having first and second transistors (Q1, Q2) and a large third transistor (Q3) sharing a common emitter resistor (Rt), and DC biasing for biasing the bases of the first, second and third transistors, whereby the first and second transistors have a DC operating current whose value I is related to the common resistor value Rt and the thermal voltage Vt by the expression Rt=Vt/2I. In this way the gain of the differential amplifier remains substantially constant over a wide range of the input signal.

This produces advantages of: a wide range of linear operation, a relative low bias current may be used, and lack of noise at the central operating point introduced by the large third transistor and the emitter resistor.

9 Claims, 1 Drawing Sheet

BIPOLAR DIFFERENTIAL AMPLIFIER

FIELD OF THE INVENTION

This invention relates to generally to bipolar differential amplifiers, and particularly to such amplifiers where linear performance, i.e., producing a differential output that linearly tracks an input, is desired.

BACKGROUND OF THE INVENTION

In the field of this invention it is known that many applications such as broadband radio frequency (RF) input stages require to be very linear with high gain and low noise.

A standard bipolar differential amplifier (sometimes called a long-tailed pair) has a tanh (hyperbolic tan) transfer characteristic, which means that there is only a small range of differential input voltage in which the differential output signal tracks the input in a linear fashion.

Several approaches are known for improving the linearity of such a bipolar differential amplifier:

1) Emitter degeneration by adding a resistance R between the two transistor emitter electrodes. This will give a linear range of +/−(I*R), where I is the current source load on each emitter electrode. A consequence of this emitter degradation approach is very high current if the gain is to be kept high by making R small. Also, the noise figure is worsened.

2) Putting in parallel several differential amplifiers with varying input DC offsets, usually by changing the emitter size of one of each transistor pair. This approach gives a limited improvement.

There is therefore a need for a bipolar differential amplifier wherein the above mentioned disadvantages may be alleviated.

BRIEF DESCRIPTION OF THE DRAWINGS

One bipolar differential amplifier incorporating the present invention will now be described, by way of example only, with reference to the accompanying drawings, in which.

DESCRIPTION OF PREFERRED EMBODIMENT

Figure 1:
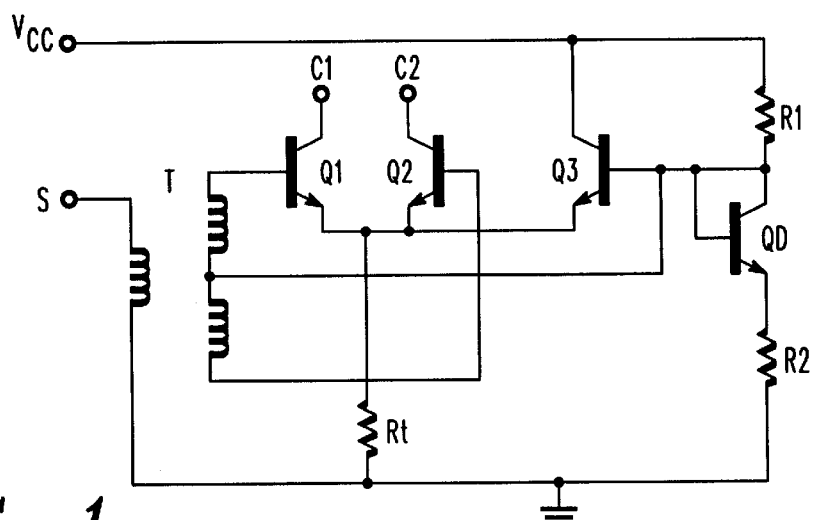
FIG. 1 shows a block schematic circuit diagram of a bipolar differential amplifier utilizing the present invention.

As shown in FIG. 1, a bipolar differential amplifier 100 includes a long-tail pair of bipolar transistors Q1 and Q2 with a common emitter resistor Rt. The transistors Q1 and Q2 have their collector electrodes arranged to be supplied with appropriate voltages at nodes C1 and C2 respectively. An input transformer T has a primary winding connected between a signal input S and a ground rail. The input transformer T also has a centre-tapped secondary winding whose ends are connected respectively to the base electrodes of the transistors Q1 and Q2 respectively, so that a varying signal applied at the input S is applied with opposite polarity to the base electrodes of the transistors Q1 and Q2.

A third bipolar transistor Q3 has its base electrode connected to the center tap of the secondary winding of the input transformer T, and has its emitter electrode connected to the emitter electrodes of transistors Q1 and Q2. The transistor Q3 has its collector electrode arranged to receive a supply voltage VCC.

A further bipolar transistor QD has its base and collector electrodes coupled to the collector electrode of the transistor Q3 via resistor a R1, and has its emitter electrode coupled to the ground rail via a resistor R2. The base electrode of the transistor QD is connected to the base electrode of the transistor Q3.

The resistance Rt (which, it will be appreciated, replaces the tail current source of a standard differential amplifier) has a low value of, say, 25 ohm. The third transistor Q3 is larger than the matched transistors Q1 and Q2, and the transistors Q1, Q2 and Q3 form a 'triple'. The transistor QD serves to bias the bases of the transistors Q1, Q2 and Q3 by a single DC voltage which sets the DC operating current of the triple to a known value, say I, for each of the two smaller transistors (Q1 and Q2) and a known value, say 2I, for the larger transistor (Q3).

As will be explained, by an appropriate choice of DC bias current, the differential output current of the two smaller transistors Q1 and Q2 can be made linear over a large range of their differential base input voltage.

The operation may be considered in three regimes as follows:

1) Close to the DC operating point the two small transistors Q1 and Q2 are operating as a differential pair, and the amplifier gain gm is given by $gm=(I_{c1}+I_{c2})/V_t=2I/V_t$, where $V_t$ is the thermal voltage (typically, $V_t=kT/q=25$ mV at 290 degrees Kelvin).

2) At somewhat larger input signals one or the other smaller transistors Q1 and Q2 steals current from the third larger transistor Q3, thus increasing $I_{c1}+I_{c2}$ and hence increasing the amplifier gm which is falling due to the tanh nature of the response.

3) At much larger signals, only one of the two smaller transistors Q1 and Q2 conducts and has taken all the current from the other two transistors of the 'triple'. The differential output gm is then 1/Rt.

The inventor of the present invention has realised that, from the above three considerations, if $1/R_t$ is made equal to $2I/Vt$ then the gm stays substantially constant between regimes.

Figure 2A:
FIGS. 2(A)–2(D) show graphs illustrating various voltages and currents occurring in the bipolar differential amplifier of FIG. 1 during use.
Figure 2B:
Figure 2C:
Figure 2D:

Referring now to FIG. 2, the collector current of the transistor Q3, as shown in FIG. 2(A), has a small peak at a center value and falls above and below this value, being relatively small at values distant from the center value. The collector current of the transistor Q2, as shown in FIG. 2(B), rises with increase in input signal. The collector current of the transistor Q1, as shown in FIG. 2(C), falls with increase in input signal. The resultant differential amplifier gain gm, as shown in FIG. 2(D), is relatively constant over a range of the input signal and has a perturbation about the centre value.

Thus it can seen that, by choosing the value of the emitter resistance value Rt and the DC bias current I such that Rt=Vt/2I, the differential amplifier gain can be made substantially constant over a wide range of the input signal.

It will be appreciated that modifications to the example described above may be made. For example, if desired, the non-signal driven transistor (i.e., transistor Q3) may have a different emitter area than the signal driven transistors (i.e., transistor Q1 and Q2), or may be DC biased to a slightly different DC bias to achieve similar results.

It will be understood that the bipolar differential amplifier described above provides the following advantages:

(i) wide range of linear operation, (ii) the DC bias current that may be used can be relatively low, and (iii) lack of noise at the central operating point introduced by the large transistor and the load resistor.

What is claimed is:

1. A bipolar differential amplifier, comprising:

first and second transistors having respective emitters, bases and collectors and connected to respond differentially to a varying input signal to produce an amplifier current signal;

a common resistor connected to the emitters of said first and second transistors for receiving said amplifier current signal;

a third transistor having an emitter, a base and a collector, said emitter being connected to the common resistor, the third transistor provides only DC bias and provides no signal amplification; and DC bias means for biasing the bases of the first, second and third transistors, whereby the first, second and third transistors apply DC operating currents to said common resistor, wherein the value of the common resistor is arranged relative to the DC operating currents flowing therein so that the gain of said amplifier current signal of the differential amplifier relative to said input signal is substantially constant over a wide range.

2. The bipolar differential amplifier according to claim 1, wherein the value of the common resistor Rt and the DC operating current I, and the thermal voltage Vt are related by the expression $Rt=Vt/2I$.

3. The bipolar differential amplifier according to claim 1 wherein the DC bias means is arranged to apply substantially the same bias voltage to the base electrodes of the first, second and third transistors.

4. The bipolar differential amplifier according to claim 1 wherein the third transistor has a larger emitter area than the first and second transistors.

5. The bipolar differential amplifier according to claim 1 wherein the DC bias means comprises a fourth transistor having base and collector electrodes commonly coupled to the base electrodes of the first, second and third transistors.

6. The bipolar differential amplifier according to claim 1, further comprising an input transformer having a primary winding for carrying said varying input signal and a secondary winding coupled between the base electrodes of the first and second transistors, said DC bias means being coupled to an intermediate tap on the secondary winding.

7. A bipolar differential amplifier, comprising:

first and second transistors;

a common resistor shared by the first and second transistors;

a third transistor sharing the common resistor;

an input transformer having a primary winding for carrying a varying input signal and a secondary winding coupled between the base electrodes of the first and second transistors; and DC bias means far biasing the bases of the first, second and third transistors, whereby the first, second and third transistors apply DC operating currents to said common resistor, wherein the value of the common resistor is arranged relative to the DC operating currents so that the gain of the differential amplifier is substantially constant over a wide range.

8. The bipolar differential amplifier according to claim 7 wherein the base electrode of the third transistor is coupled to an intermediate tap on the secondary winding.

9. The bipolar differential amplifier according to claim 8 wherein the intermediate tap on the secondary winding is a centre tap.

* * * * *